United States Patent [19]
Yamaguchi

[11] Patent Number: 6,093,603
[45] Date of Patent: Jul. 25, 2000

[54] FABRICATING SEMICONDUCTOR MEMORY DEVICES WITH IMPROVED CELL ISOLATION

[75] Inventor: Kiyoshi Yamaguchi, Kasai, Japan

[73] Assignee: Ricoh Company, Ltd., Tokyo, Japan

[21] Appl. No.: 08/846,009

[22] Filed: Apr. 25, 1997

[30] Foreign Application Priority Data

Apr. 26, 1996 [JP] Japan ................................. 8-131008

[51] Int. Cl.<sup>7</sup> ................................................. H01L 21/336
[52] U.S. Cl. ........................... 438/257; 438/297; 438/439; 257/314; 257/316; 257/509
[58] Field of Search ..................................... 438/439–453, 438/257–267, 448; 257/315–318, 395–399, 400, 411, 509, 647

[56] References Cited

U.S. PATENT DOCUMENTS

| | | | |
|---|---|---|---|
| 4,855,800 | 8/1989 | Esquivel et al. | 257/316 |
| 4,868,619 | 9/1989 | Mukherjhee et al. | 257/300 |
| 4,939,386 | 7/1990 | Shibata et al. | 327/581 |
| 5,032,881 | 7/1991 | Sardo et al. | 257/316 |
| 5,051,809 | 9/1991 | Kiyohara | 257/211 |
| 5,081,052 | 1/1992 | Kobayashi et al. | 438/278 |
| 5,280,446 | 1/1994 | Ma et al. | 365/185.15 |
| 5,293,328 | 3/1994 | Amin et al. | 257/315 |
| 5,308,781 | 5/1994 | Ando et al. | 438/301 |
| 5,358,893 | 10/1994 | Yang et al. | 437/70 |
| 5,362,662 | 11/1994 | Ando et al. | 438/278 |
| 5,436,479 | 7/1995 | Devin | 257/317 |
| 5,455,793 | 10/1995 | Amin et al. | 257/315 |
| 5,466,624 | 11/1995 | Ong et al. | 437/52 |
| 5,687,118 | 11/1997 | Chang | 257/315 |
| 5,747,357 | 5/1998 | Su | 437/69 |
| 5,821,581 | 10/1998 | Kaya et al. | 257/321 |

OTHER PUBLICATIONS

Abstract of USP 5019527 corresponding to Japanese publication 3072681.

S. Wolf and R.N. Tauber, Silicon Processing for the VLSI Era, vol. 1, Lattice Press, pp. 192, 251–256, 303–308, and 407–408, 1986.

Primary Examiner—Donald L. Monin, Jr.
Assistant Examiner—Hoai Pham
Attorney, Agent, or Firm—Cooper & Dunham LLP

[57] ABSTRACT

A method of fabricating semiconductor memory devices which has sufficient cell isolation to achieve miniaturization at the 0.3 to 0.4 μm level. In the semiconductor memory devices of the present application miniaturization is achieved by removing overlap allowances between each gate and each LOCOS and those between each diffusion layer and each LOCOS used to separate the above-described semiconductor memory elements. In one embodiment, the method according to the present application includes forming LOCOSs in forms of stripes in parallel with a direction in which a select gate is formed in forming the LOCOSs for separating respective semiconductor memory elements, forming laminated gate portions each including a floating gate and a control gate perpendicularly to the LOCOSs, forming strip-shaped resist layers in parallel with the select gate so as to cover portions to be selection transistors and a part of the upper regions in the selection transistor side of the above laminated gate portions, etching the LOCOSs by using the resist layers and the laminated gate portions as masks, forming impurity diffusion layers to be source lines and drain lines by using the above resist layers and the above laminated gate portions as masks, and then forming select gates, and therefore it does not need the mask matching allowances between the laminated gates and the LOCOSs nor the mask matching allowances between the source diffusion layers and the LOCOSs which have conventionally prevented the miniaturization due to its self-alignment feature. In addition, patterning is performed by combinations of strip and therefore the corners of the LOCOSs are not rounded off so as to decrease the mask matching allowances between the floating gates and the LOCOSs.

9 Claims, 18 Drawing Sheets

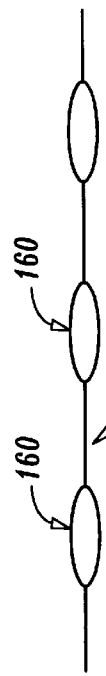
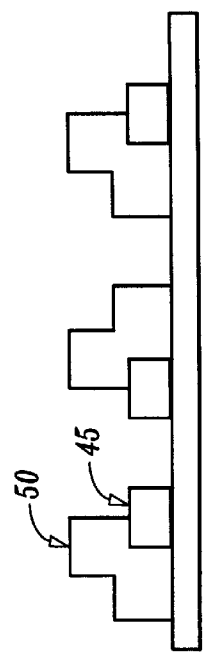
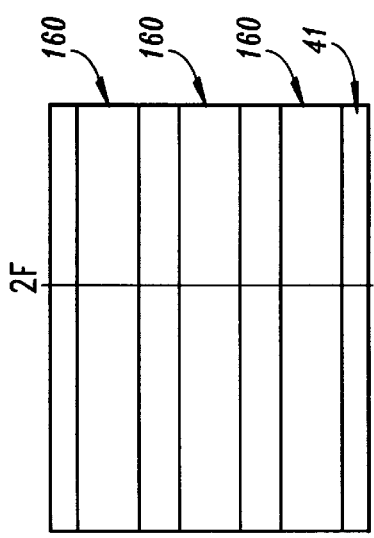
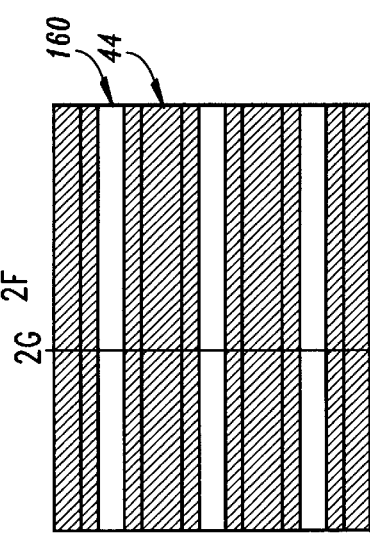
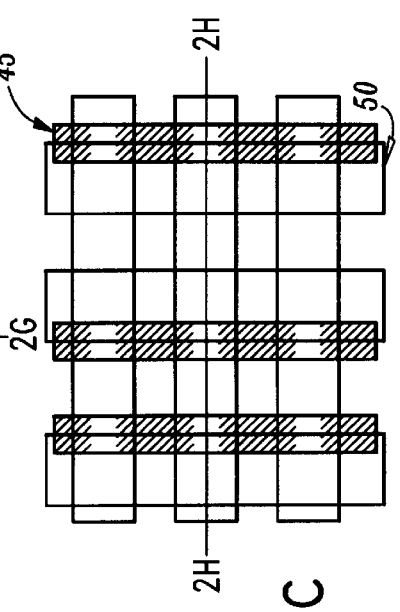

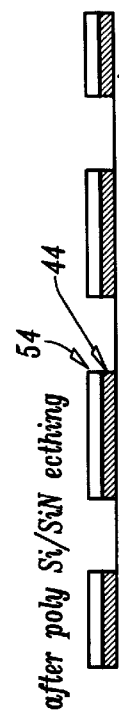
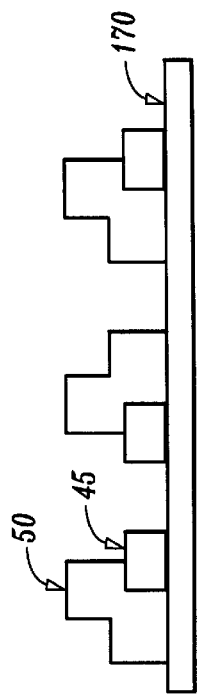
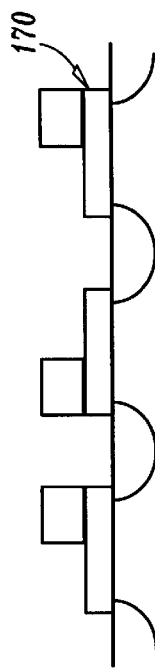
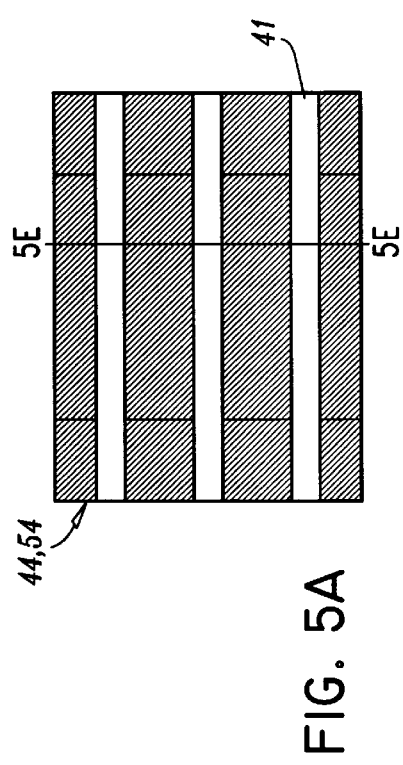
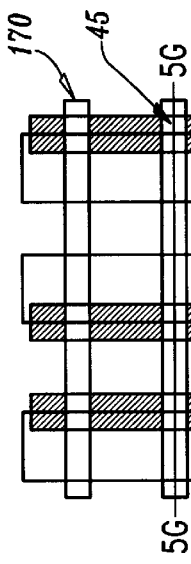
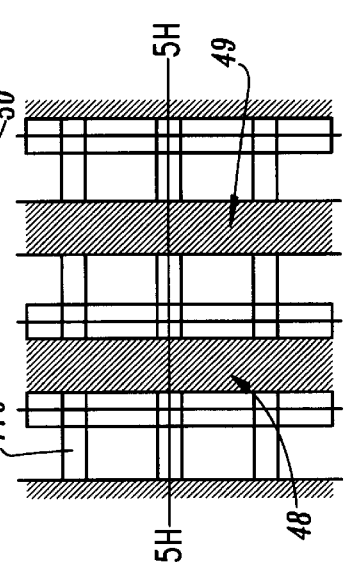

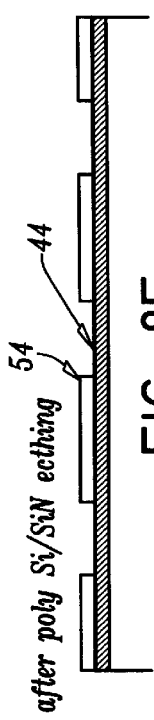
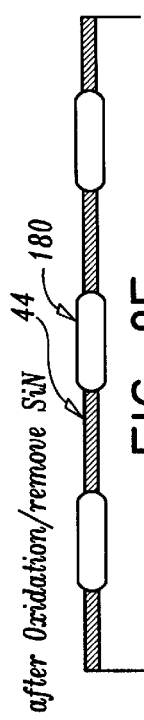
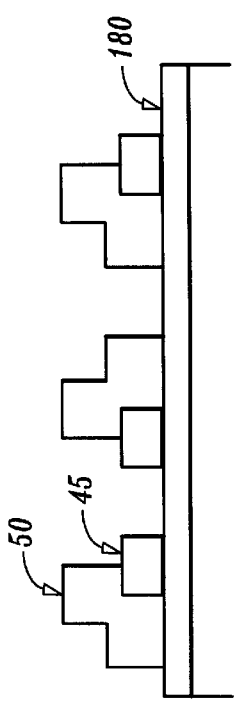
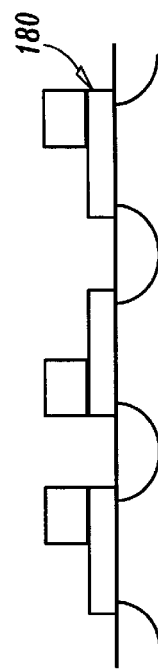
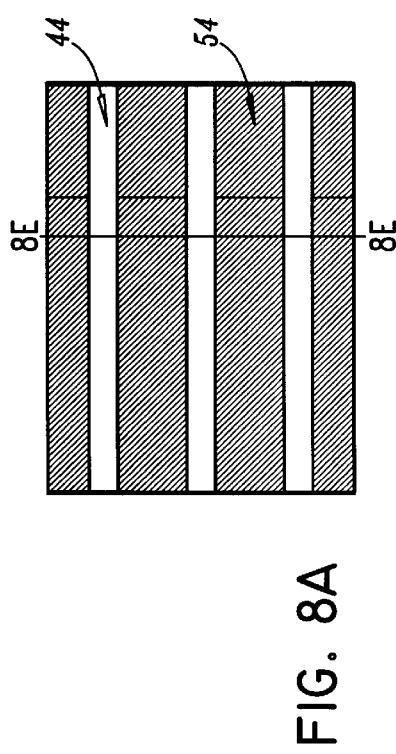
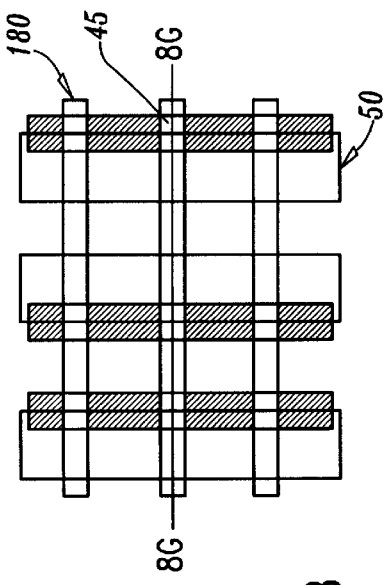
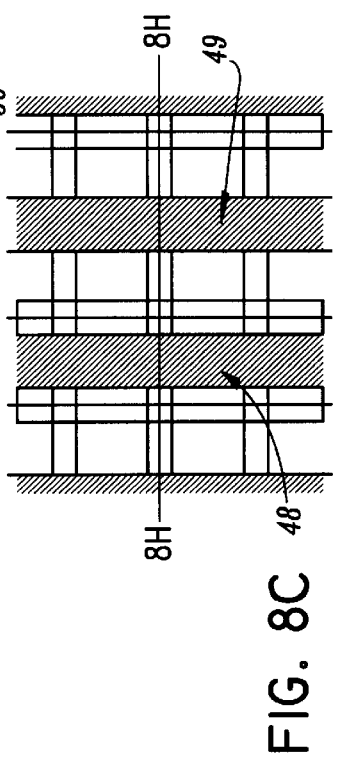

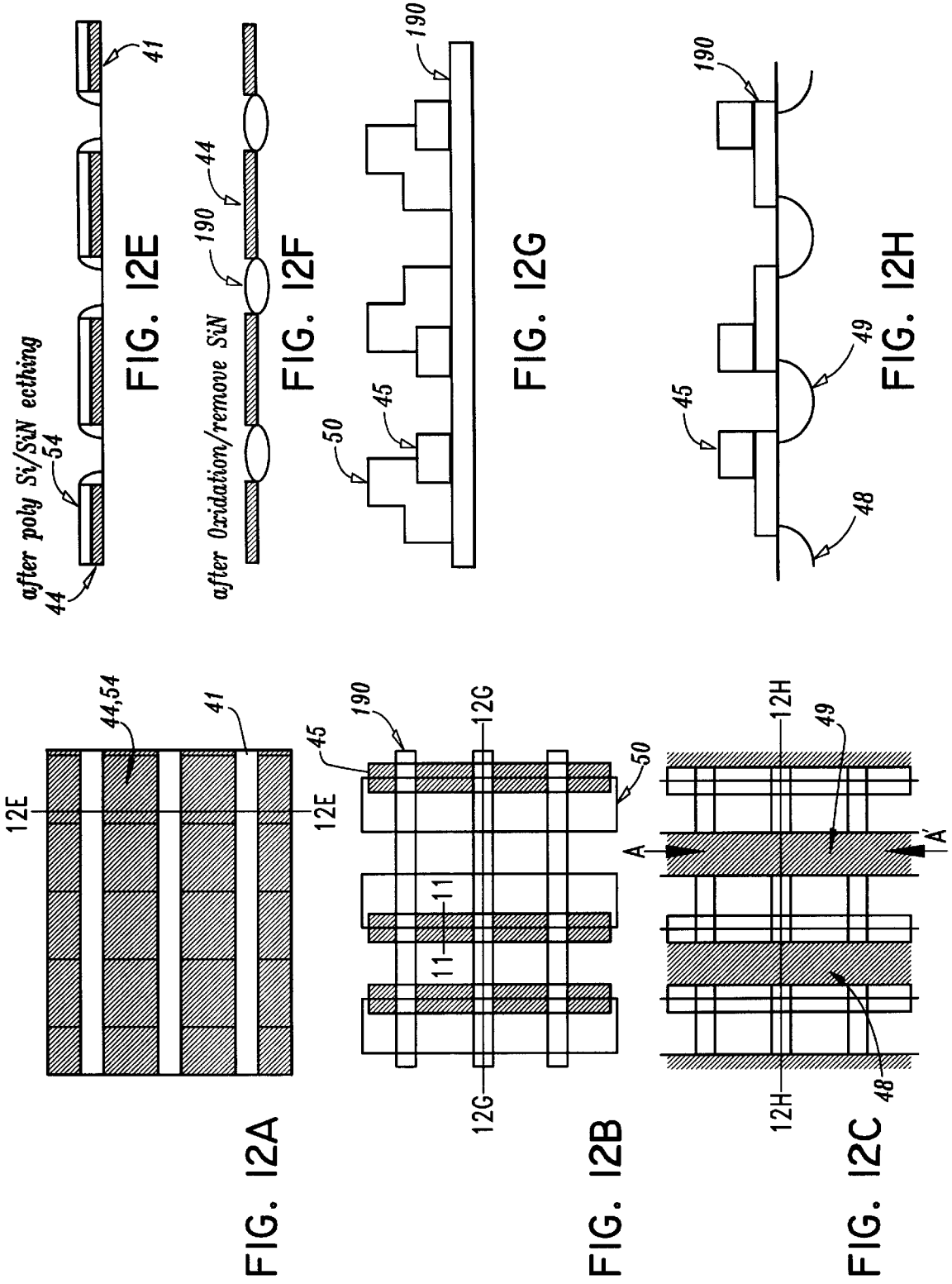

FABRICATING SEMICONDUCTOR MEMORY DEVICES WITH IMPROVED CELL ISOLATION

BACKGROUND

1. Field of the Invention

The present invention relates to a method of fabricating a semiconductor memory device, and more particularly to a method of fabricating a nonvolatile semiconductor memory device which has floating-gates and is electrically writable and erasable.

2. Description of the Related Art

Electrically writable and erasable nonvolatile semiconductor memory devices (EEPROM) conventionally have two transistors per bit which occupy a large area, resulting in high cost devices. As a result, such devices have been used for limited purposes. In recent years, however, research and development has progressed for a flash EEPROM memory device which use a single transistor per bit. One type of flash memory device is discussed in U.S. Pat. No. 5,280,446.

FIG. 14 is a cross section of a semiconductor memory element discussed in U.S. Pat. No. 5,280,446. In this semiconductor memory element, a first insulating film 42 is formed on a p-type semiconductor substrate 41. Film 42 is obtained by oxidizing the p-type semiconductor substrate 41. A first polysilicon layer (polycrystal silicon layer) 44 which is doped with impurities on the insulating thin film 42, and then a second insulating layer 50 is deposited on the first polysilicon layer 44. The second insulating layer 50 can be a single layer of, for example, silicon oxide ($SiO_2$) which is formed by oxidizing the first polysilicon layer 44, or the second insulating layer can be a multilayer structure of, for example, ONO. A floating-gate 44 is formed by pattern-etching the second insulating layer 50 and the first polysilicon layer 44, and a control gate 45 is formed by depositing a second polysilicon layer 45 on the second insulating layer 50 and then pattern-etching the second polysilicon layer 45. In other words, the first polysilicon layer serves as the floating-gate 44 and the second polysilicon layer serves as the control gate 45. A laminated structure of the first polysilicon layer, the second insulating layer, and the second polysilicon layer is called a stacked gate structure.

Additionally, a drain 48 and a source 49 are formed on the p-type semiconductor substrate 41 by implanting n-type dopants. Further, a third insulating layer 51 is deposited on the above stacked gate structure. After pattern etching of the insulating layer 51, a select gate 47 is formed so as to cover the control gate electrode 45, the drain 48, and the source 49.

FIG. 15 is an equivalent circuit of the semiconductor memory element shown in FIG. 14. This semiconductor memory element serves as a nonvolatile memory element. In the semiconductor memory element, voltages of 5 V, 12 V, and 2 V are applied to the drain 48, the control gate 45, and the select gate 47, respectively, during programming (a write operation) for the memory element. These applied voltages set the channel region under the floating gate 44 on and a voltage in the source side (point N in FIG. 15) of a floating gate transistor becomes a drain voltage (5 V). On the other hand, a channel region under the select gate 47 is weakly set on, and a drop of the voltage in the channel region under the select gate 47 is small so that a voltage at the point M in FIG. 15 becomes about zero. This causes an electric potential difference between the point M and the point N. This potential difference, increases the speed of channel electrons passing between the point M and the point N so that they are changed to hot electrons.

These hot electrons are implanted into the floating gate 44 by means of a voltage from the control gate 45. As described above, in the configuration shown in FIG. 14, the electrons are implanted into the floating gate 44 from the source side of the floating gate 44. This is known as source side injection. The efficiency of implanting electrons using source side injection is greater than that of implanting electrons from the drain side, which is typically done. Thus, a single power supply can be used with source side injection.

FIGS. 16 and 17 are a sectional view and a plan view, respectively, of a memory cell array (a semiconductor memory device) having a 4×4 matrix configuration composed of semiconductor memory elements (memory cells) shown in FIG. 14. In this semiconductor memory device (memory cell array), select gates 47 (SG) are arranged in rows overlaying a plurality of control gates 45 (CG), and a plurality of source and drain lines 48 and 49. Each select gate row extends in a single direction so as to be perpendicular to the control gates 45 and the drain and source gates 48 and 49. The control gate 45, drain lines 48 and the source lines 49 are arranged in alternating columns, each being parallel with the control gates (CG) as seen in FIG. 17.

In this semiconductor memory device, each semiconductor memory element has a floating-gate electrode 44 formed on first insulating thin film (a gate oxidation film) 42 on a semiconductor substrate 41, and a line-shaped control gate electrode 45 covering the floating-gate electrode 44 through a second insulating film 50 (an ONO laminated film). A line-shaped select gate 47 extends over the top and side surfaces of the stacked gate structure which is composed of floating gate 44 and control gate 45 through insulating films, such as films 51 and 50, and over a part of the substrate 41 through the first insulating thin film 42 (a gate oxidation film) on the substrate 41. The stacked gate structure is arranged perpendicular to the select gate 47. Line-shaped substrate diffusion regions (e.g., the source line 49 and the drain line 48) are alternately arranged parallel with the control gate, wherein one of the diffusion regions (the source 49) is offset from the control gate 45 (or the stacked gate structure) so that it is possible to achieve a matrix selection of respective semiconductor memory element regions using the control gate 45 and the select gate 47.

FIG. 18 shows an equivalent circuit of the semiconductor memory device (memory cell array) shown in FIGS. 16 and 17. To select memory cell P1 for a storage operation, a voltage of 5 volts is applied to drain line D1 and source line S2, a voltage of 12 volts is applied to control gates CG1 and CG2, and a voltage of about 2 volts is applied to select gate SG1. Other lines are kept at a grounding potential. The reason for applying 5 volts to the source line S2 is to inhibit a storage operation in an unselected adjacent cell P5 which is in the same line as cell P1. In addition, with a difference of potentials between the drain D1 and the source S2 set to be about 0 volts, hot electrons are inhibited from being generated in the unselected adjacent cell P5. Further, source S2 is not adjacent to the floating-gates and, therefore, blocks noise and the like from occurring.

As described above, the selected memory cell P1 can be used for the storage operation by implanting electrons (hot electrons) from the source side of the floating-gates. Accordingly, this memory circuit can be operated by using a single 5 volt power supply. In addition, an element in the memory cell array can be selected using the control gates (CG) and select gates (SG) shown in FIGS. 16–18. Therefore, in a circuit wired in a contactless NOR system, adjacent memory cells can share a diffusion layer of a source line and a drain line so that the area of the memory array can be reduced.

However, in the above semiconductor memory device (the memory cell array), a rectangular LOCOS (local oxidation structure) 150 is required for separating respective elements (cells) in the memory cell array. This LOCOS structure is shown in FIG. 19. The corners of this rectangular LOCOS 150 are rounded off when miniaturizing the semiconductor memory device. Typically, the rounded off LOCOS is not a problem with semiconductor devices. However, the rounded off LOCOS becomes more of a problem in semiconductor devices classified as 0.35 to 0.4 µm generation devices. When fabricating such devices and in future smaller devices the light wavelength used in a lithographic process is substantially the same as the minimum size of a pattern. Therefore, when fabricating conventional semiconductor memory devices shown in FIGS. 16 and 17, a mask is required that has an overlaying mask matching allowance (X2) between the laminated gate and the LOCOS and an overlaying mask matching allowance (X5) between the source diffusion layer and the LOCOS. However, using conventional fabricating techniques limits the reductions in the overlap allowances between each gate and each LOCOS, and between each diffusion layer and each LOCOS as well as other reductions in other dimensions.

SUMMARY

The present application provides a method of fabricating semiconductor memory devices which has sufficient cell isolation to achieve miniaturization to the 0.3 to 0.4 µm level. In the semiconductor memory devices of the present application miniaturization is achieved by removing overlap allowances between each gate and each LOCOS and those between each diffusion layer and each LOCOS used to separate the above-described semiconductor memory elements.

In one embodiment, the method according to the present application includes forming LOCOS in forms of stripes in parallel with a direction in which a select gate is formed in forming the LOCOS for separating respective semiconductor memory elements, forming a stacked gate structure, forming strip-shaped resist layers in parallel with the select gate so as to cover portions forming selection transistors and a part of the upper regions in the selection transistor side of the stacked gate structure, etching the LOCOS by using the resist layers and the stacked gate structure as masks, forming impurity diffusion layers to be source lines and drain lines by using the above resist layers and the stacked gate structure as masks, and then forming select gates. Therefore, there is no need for the mask matching allowances between the stacked gates and the LOCOS, nor for the mask matching allowances between the source diffusion layers and the LOCOSs, which have conventionally prevented the miniaturization. In addition, patterning is performed by combinations of strips and therefore the corners of the LOCOSs are not rounded off so as to decrease the mask matching allowances between the floating gates and the LOCOSs.

BRIEF DESCRIPTION OF THE DRAWINGS

Preferred embodiments of the invention are described hereinbelow with reference to the drawings wherein:

FIGS. 2A–2I illustrate an exemplary fabrication process for the semiconductor memory device of FIG. 1;

FIGS. 5A–5H illustrate an exemplary fabrication process for the semiconductor memory device in FIG. 1;

FIGS. 8A–8H illustrate an exemplary fabrication process for the semiconductor memory device in FIG. 1;

FIGS. 12A–12D illustrate an exemplary fabrication process for the semiconductor memory device of FIGS. 10 and 11;

DETAILED DESCRIPTION OF THE PREFERRED EMBODIMENTS

Figure 1:
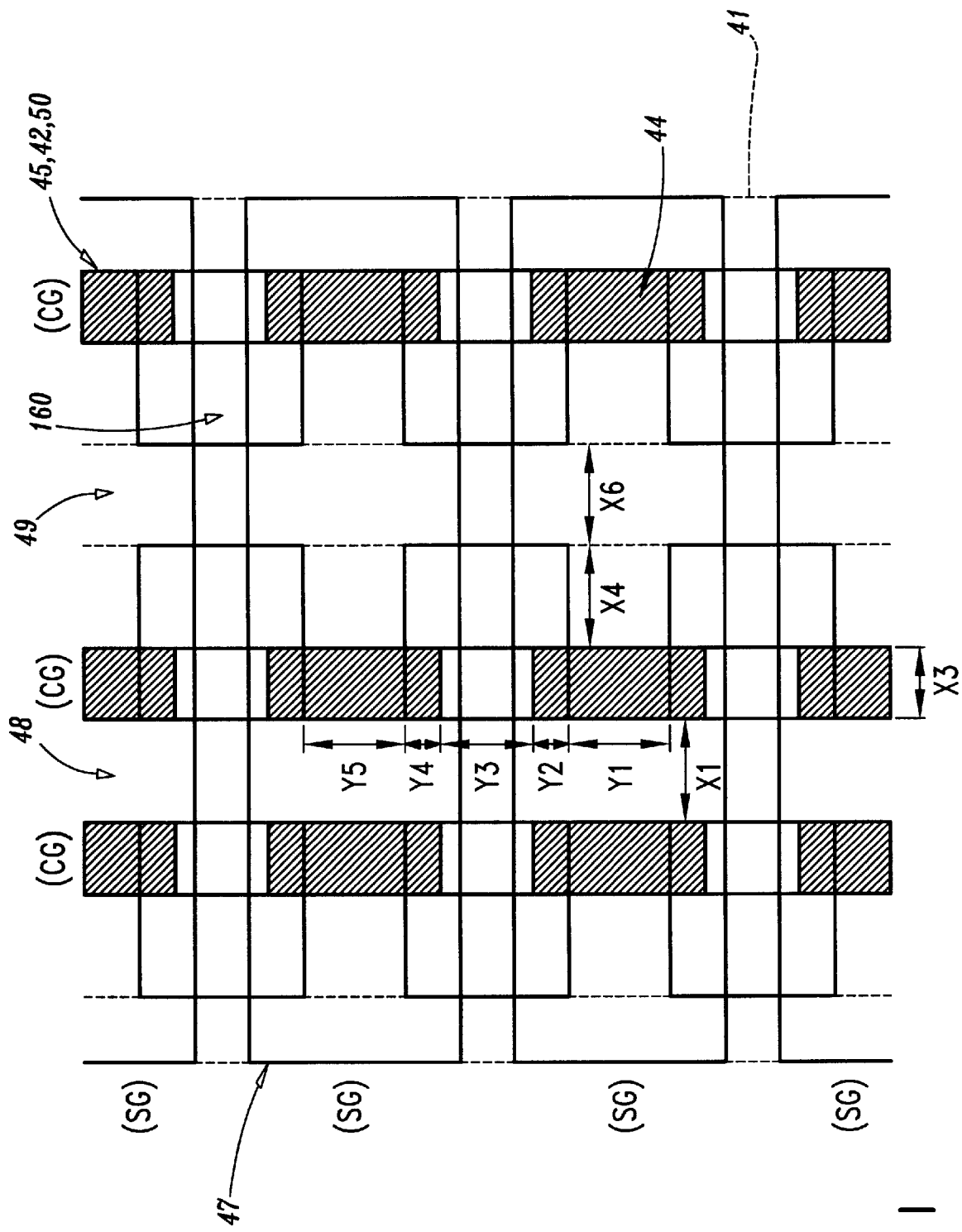
FIG. 1 is a top plan view of a first embodiment of a semiconductor memory device according to the present application.

A description will be given of embodiments according to the present invention, by referring to accompanying drawings. FIG. 1 is a (plan) view illustrating a first embodiment of a semiconductor memory device according to the present invention. Referring to FIG. 1, this semiconductor memory device includes semiconductor memory elements (memory cells) which are substantially the same as the memory cells seen in FIG. 14, arranged in a form of a matrix which is configured as a memory cell array, similar to the array seen in FIGS. 16 and 17.

In the semiconductor memory device (memory cell array) in FIG. 1, select gates 47 (SG) extend over control gates 45 (CG), drain lines 48, and source lines 49 in a single direction which is perpendicular to the control gates 45. The drain lines 48 and the source lines 49 extend in a channel width direction parallel with the control gates (CG) and they are alternately arranged. In other words, the control gates (CG), the drain lines, and the source lines extend in a transverse direction and the select gates (SG) extend in a channel length.

Each semiconductor memory element of the semiconductor memory device in FIG. 1 includes a floating gate 44 formed through a first insulating thin film (gate oxidation film) 42 on a semiconductor substrate 41. A line-shaped control gate 45 covers the floating gate 44 through a second insulating film 50 (e.g., an ONO laminated film). A line-shaped select gate 47 extends over top and side surfaces of the stacked gate structure and over a part of the substrate 41 through the first insulating thin film (gate oxidation film) 42 on the substrate 41. The select gate line is arranged perpendicularly to the control gate 45. Line-shaped substrate diffusion regions (i.e., the source 49 and drain 48) are alternately arranged in parallel with the control gate 45 such that one of the diffusion regions (e.g., the source 49) is offset from control gate 45 so that it is possible to select a matrix of respective semiconductor memory element regions using the control gate 45 and the select gate 47. In the semiconductor memory element in FIG. 14, a region indicated by a reference numeral 53 (an offset portion) is hereinafter referred to as a selection transistor.

Figure 14:
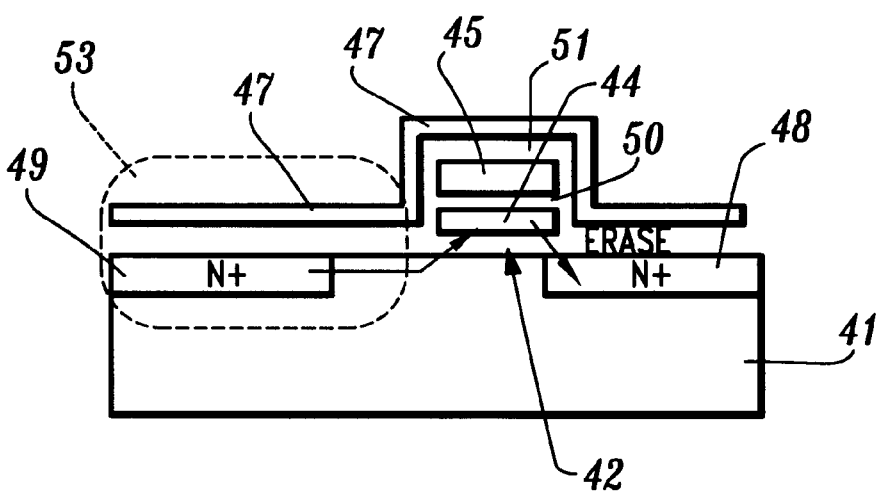
FIG. 14 is a cross-sectional view of a conventional semiconductor memory element.
Figure 15:
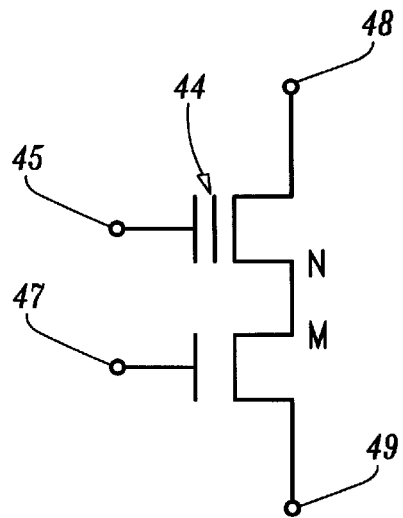
FIG. 15 is a circuit diagram of the conventional semiconductor memory device of FIG. 14.
Figure 18:
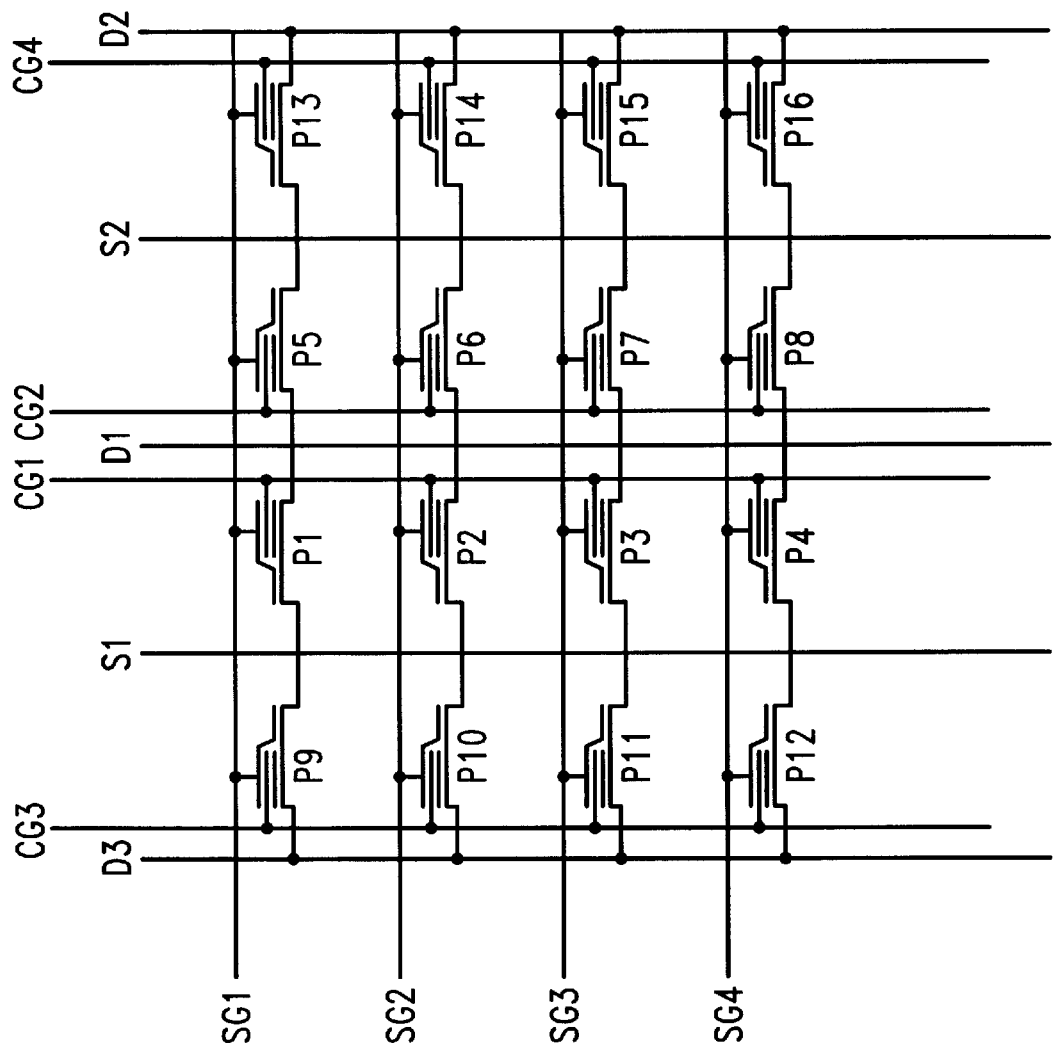
FIG. 18 is a circuit diagram of the conventional semiconductor memory device of FIGS. 16 and 17.
Figure 19:
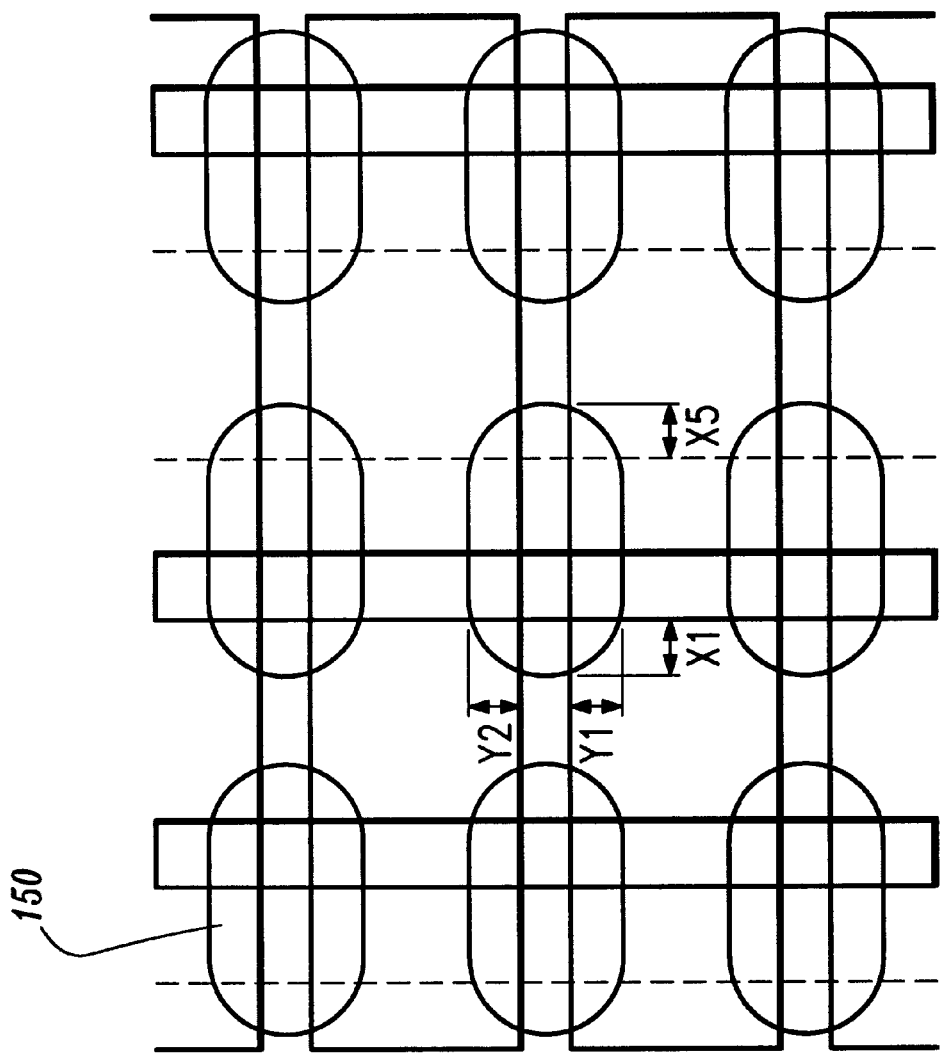
FIG. 19 is a view illustrating an example of rectangular LOCOSs whose corners are rounded off.

An equivalent circuit diagram of the semiconductor memory device (memory cell array) in FIG. 1 is as shown in FIG. 14. For example, to select memory cell P1, seen in FIG. 18, for a storage operation, a voltage of 5 volts is applied to drain line D1 and source line S2, a voltage of 12 volts is applied to control gates CG1 and CG2, and a voltage of about 2 volts is applied to a select gate SG1. Other lines are kept at ground potential. With the above-applied voltages, the selected memory cell P1 can be used for the storage operation by implanting electrons (hot electrons) from the source side of the floating-gates. As described above, this memory circuit can be operated by using a single 5 volt power supply. In addition, an element can be selected with the matrix using a control gate (CG) and a select gate (SG) in the memory cell array shown in FIG. 1. Therefore, in a circuit wired in a contactless NOR system, adjacent memory cells can share a diffusion layer of a source line and a drain line. As a result, the area of the memory array can be reduced.

Figure 2I:
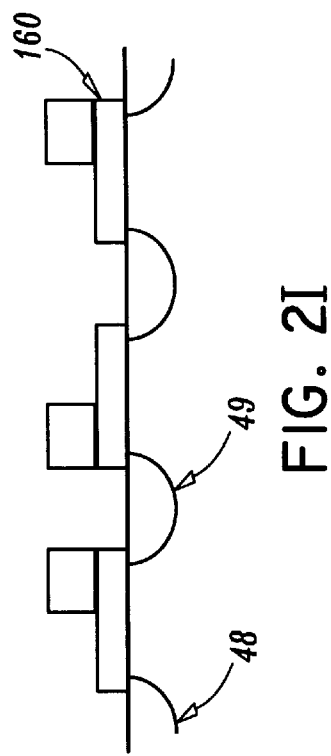
Figure 2D:
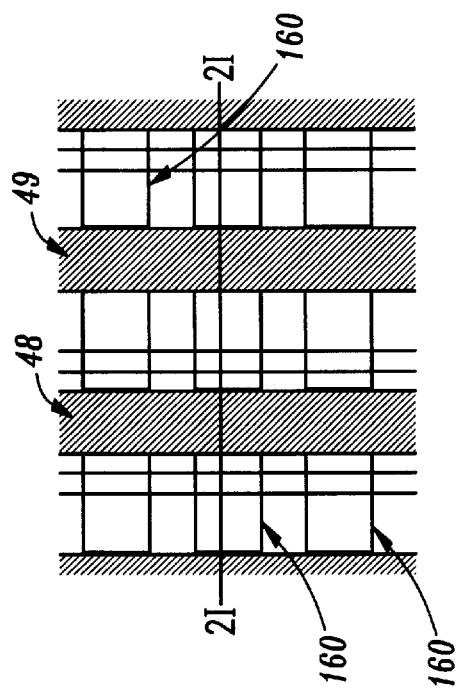

As noted above, the present application provides a method for fabricating semiconductor memory devices that do not have rounded corners for each rectangular LOCOS. FIGS. 2A–2I illustrate one embodiment for the fabrication process for the semiconductor memory device. To fabricate the semiconductor memory device in FIG. 1, each LOCOS 160 is formed in a form of a strip on a p-type semiconductor substrate 41 (FIG. 2A). A first insulating thin film 42 (gate oxidation film), not shown in FIGS. 2A–2I, is formed by thermal oxidation over a surface of the p-type semiconductor substrate 41. A polysilicon layer 44 (e.g., a polycrystal silicon layer) forming the floating gate is then formed on the first insulating layer. After that, the polysilicon layer 44 is etched away in forms of strips in parallel with the LOCOS 160 so as to remove the polysilicon layer 44 on the LOCOS 160, seen in FIG. 2B.

A second insulating layer (e.g., an ONO laminated layer of a silicon oxidation film, a silicon nitride film, and a silicon oxidation film), not shown, is formed on the floating gate 44, and a control gate 45 is formed over the second insulating layer. The control gate 45 is a polysilicon layer (e.g., a polycrystal silicon layer). Further, a silicon oxidation layer forming an insulating film between the control gates and the select gates is formed. A silicon nitride layer (not shown) forming mask layers in a LOCOS etching process are formed over the surface.

Subsequently, the surface is etched away in forms of strips perpendicular to each LOCOS 160 from the topmost layer to the floating gates 44 so as to form each stacked gate structure in which the floating gate 44, the control gate 45, and respective insulating layers are deposited. Furthermore, a silicon oxidation film is formed over the surface and then etched back so as to form a protection layer (not shown) made of the silicon oxidation film with a self-alignment process on sidewalls of the stacked gate structure. After that, strip-shaped resist layers 50 are formed in parallel with the control gates 45 so as to cover portions to be selection transistors and a part of the upper regions in the selection transistor side of the above stacked gate structures (FIG. 2C).

Subsequently, the LOCOS 160 is etched away up to the substrate 41 using the above resist layer 50 and the stacked gate structure as masks. N-type impurities are then implanted on the surface of the substrate 41 where the LOCOS is removed by using the above resist layer 50 and the stacked gate structure as masks so as to form a drain diffusion line 48 and a source diffusion line 49, seen in FIG. 2D.

The resist layer 50 and the topmost silicon nitride film layer of the stacked gate structure are removed by thermal oxidation so as to form a gate oxidation film layer in a portion forming a selection transistor 53.

Figure 2E:
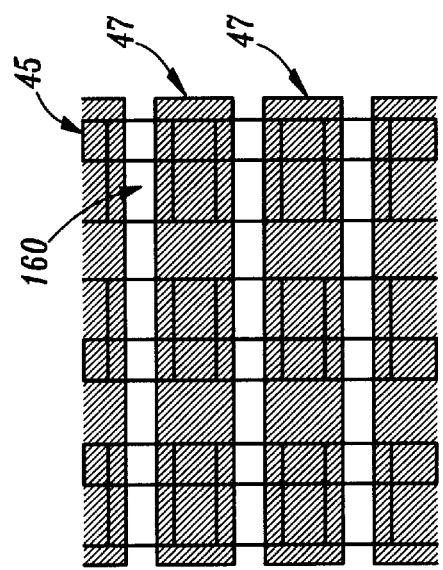

Next, a polysilicon layer (e.g., a polycrystal silicon layer) forming a select gate 47 and a tungsten silicide layer are formed over the wafer sequentially, and then the surface is etched away to form select gates 47 which are in strips perpendicular to the stacked gate structures, seen in FIG. 2E.

Figure 3:
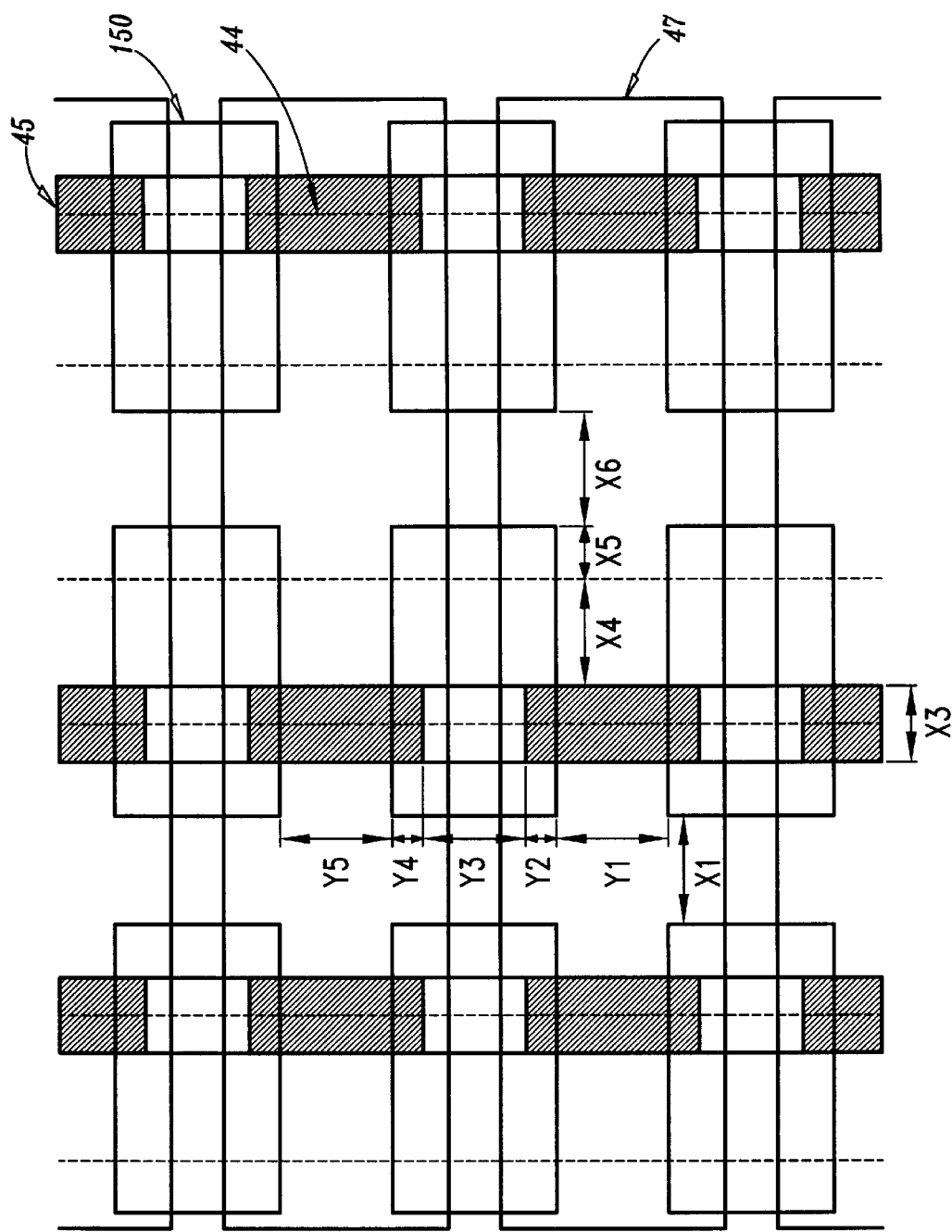
FIG. 3 illustrates a conventional semiconductor memory device for comparison with the semiconductor memory device according to the present application.
Figure 16:
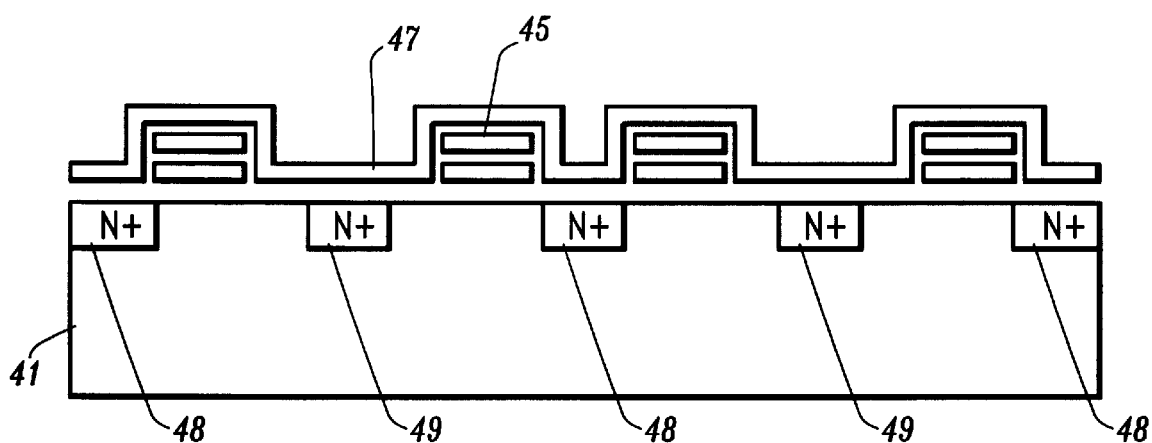
FIG. 16 is a cross-sectional view of a conventional memory cell array in a 4×4 matrix constructed using the semiconductor memory device of FIG. 14.
Figure 17:
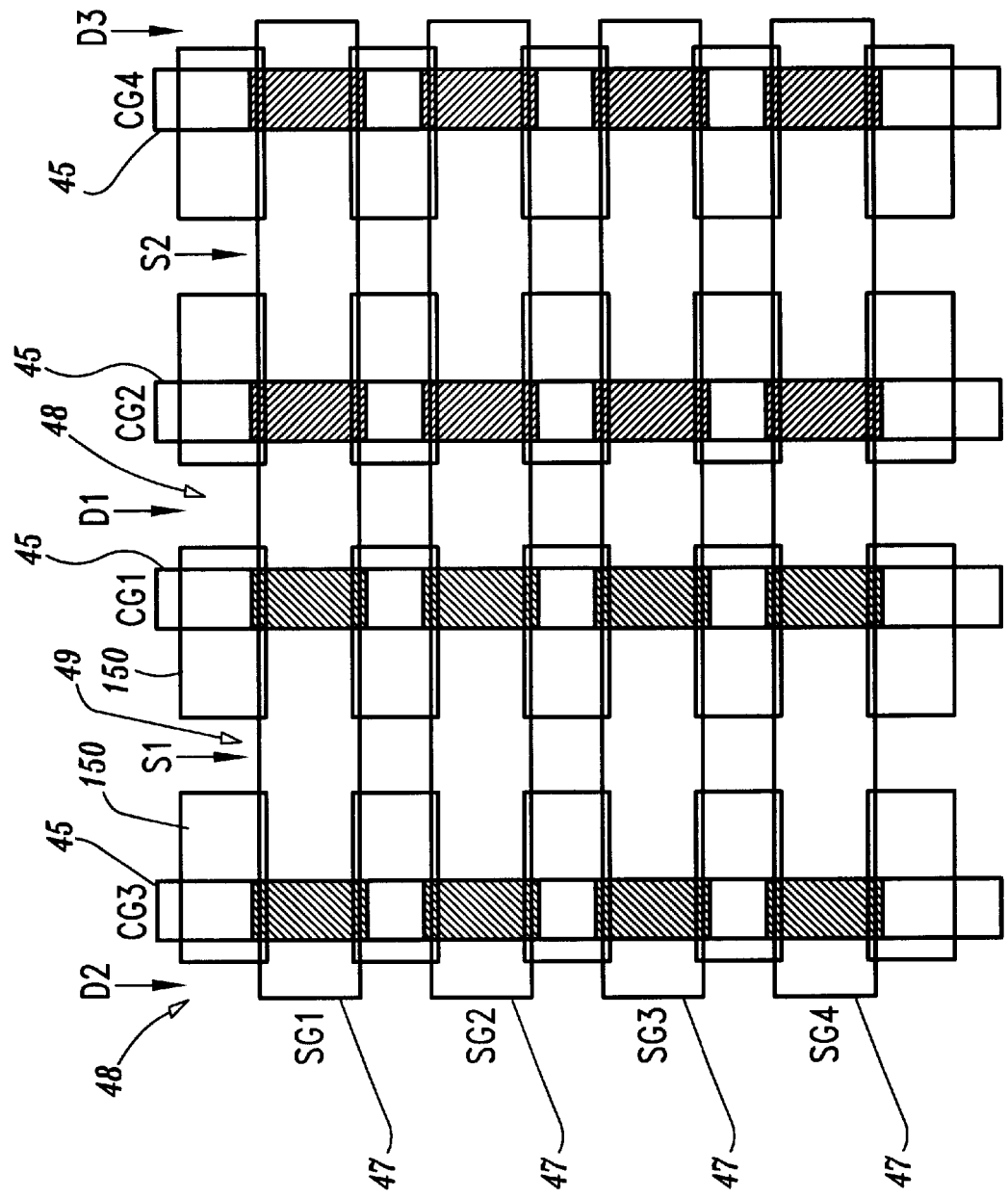
FIG. 17 is a top plan view of a conventional memory cell array in a 4×4 matrix constructed using the semiconductor memory device of FIG. 14.

For comparison with the semiconductor memory device in FIG. 1, FIG. 3 shows the above-described conventional semiconductor memory device (the same semiconductor memory device as the one shown in FIGS. 16 and 17). The semiconductor memory device of the present application shown in FIG. 1 does not need the mask matching allowance (X2) between each stacked gate structure and the LOCOS. Further, the semiconductor memory device does not need the mask matching allowance (X5) between each source diffusion layer 49 and the LOCOS. As noted, these matching allowances have conventionally prevented the miniaturization of semiconductor memory elements. In addition, in the process shown in FIGS. 2A–2I, patterning is performed with combinations of strips and therefore the corners of each rectangular LOCOS are not rounded off, so that mask matching allowances Y2 and Y4 between each floating gate 44 and the LOCOS can also be reduced. As a result, the method of the present application achieves miniaturization of the semiconductor memory device to the 0.35 to 0.4 $\mu$m level which cannot be achieved in prior art devices.

Further, in the fabrication process in FIGS. 2A–2I, a silicon nitride film is used for the topmost layer of each stacked gate structure in the etching process of the LOCOS 160. Thus, the silicon oxidation film on the control gate 45 is prevented from being etched away in the LOCOS etching process so as not to reduce the thickness of the silicon oxidation film on the control gate 45.

In the fabrication process of FIGS. 2A–2I, it is possible to reduce damage to the gate oxidation films and the insulating films (e.g., the second insulating film) between the floating gate 44 and the control gate 45 that may occur during the LOCOS etching process. This occurs because the sidewall portions of the stacked gate structures are covered with a protection layer (not shown) formed in self-alignment to the stacked gate structures when etching the LOCOSs 160.

Figure 4:
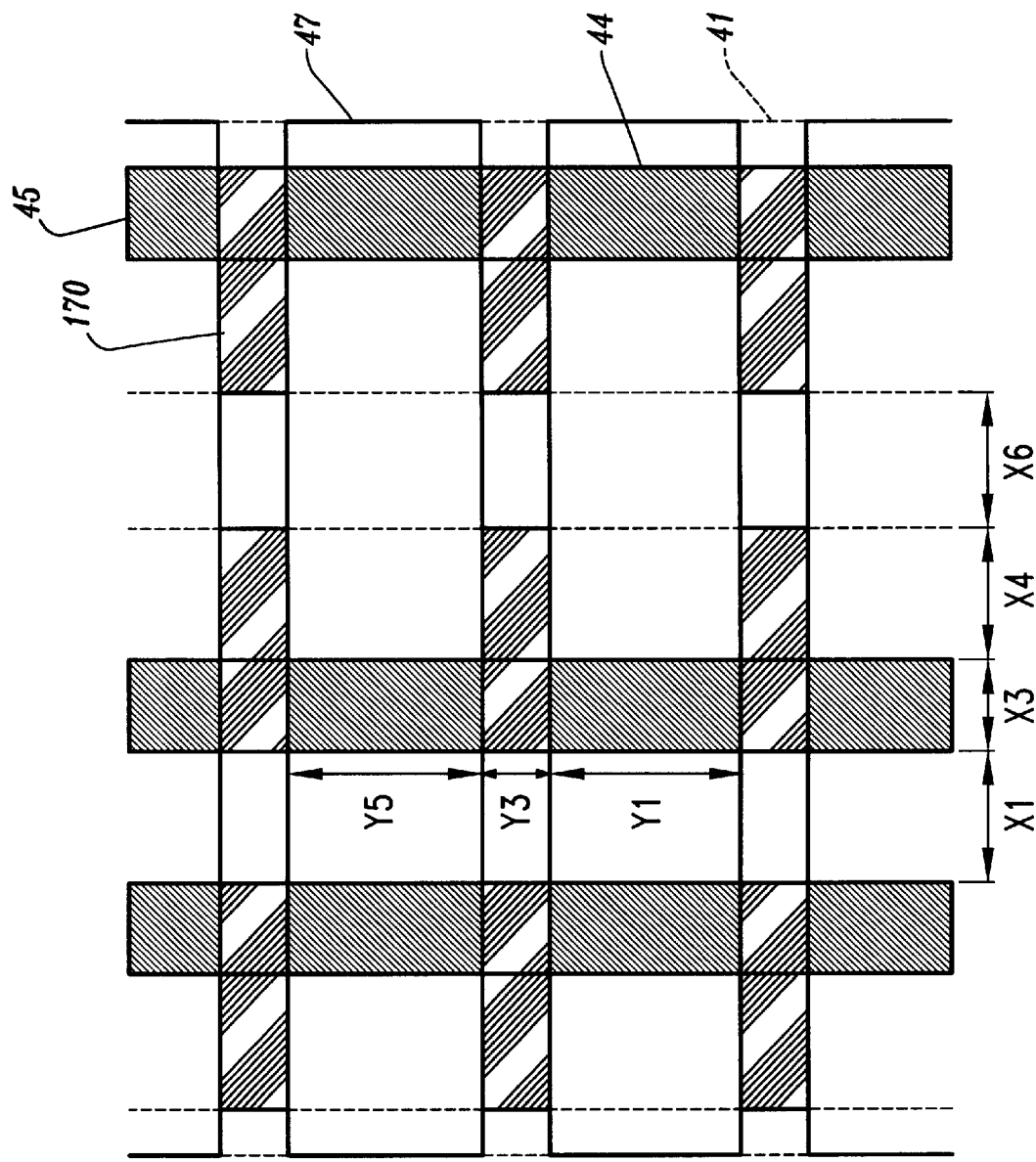
FIG. 4 is a top plan view of a second embodiment of the semiconductor memory device according to the present application.

FIG. 4 illustrates a second embodiment of a configuration of the semiconductor memory device according to the present application. In the semiconductor device of FIG. 4, each LOCOS 170 is formed so as to have a narrower width in the Y direction in comparison with the LOCOS 160 formed in the semiconductor memory device in FIG. 1. In other words, the width in the Y direction of the LOCOS 160 is equal to (Y2+Y3+Y4) in the semiconductor memory device in FIG. 1, while the width in the Y direction of the LOCOS 170 is equal to Y3 in the semiconductor memory device in FIG. 4, which is narrower than that of the LOCOS 160 of the semiconductor memory device shown in FIG. 1 by (Y2+Y4). This occurs because there is no need for mask matching allowances Y2 and Y4 between the floating gate 44 and the LOCOS 170. Therefore, in the semiconductor memory device in FIG. 4, further miniaturization can be achieved.

FIGS. 5A–5H illustrates a fabrication process for the semiconductor memory device shown in FIG. 4. To fabricate the semiconductor memory device in FIG. 4, a gate oxidation film ilayormed by thermal oxidation on a p-type semiconductor substrate 41. A polysilicon layer 44 (e.g., a polycrystal silicon layer) forming a floating gate, and a silicon nitride layer 54 forming an oxidation inhibition layer are formed over the gate oxide film. The oxidation inhibition layer 54 (silicon nitride film) and the polysilicon layer 44 are then etched away to form strips which are in parallel with a channel length direction. FIG. 6 illustrates the semiconductor memory element after etching the oxidation inhibition layer 54 (silicon nitride layer) and the polysilicon layer 44 in strips (or slits).

The substrate 41 is then oxidized using the oxidation inhibition layer 54 (silicon nitride layer) as a mask and then each LOCOS 170 for separating respective memory element is formed on the substrate 41. After that, the silicon nitride film 54 for inhibiting oxidation is removed.

A second insulating film (e.g., an ONO laminated layer of a silicon oxidation film, a silicon nitride film, and a silicon oxidation film) is formed over the floating gate, and a polysilicon layer 45 (a polycrystal silicon layer) forming control gates is formed over the second insulating layer. Further, a silicon oxidation film forming an insulating film between each control gate and each select gate is formed. Silicon nitride layers used as mask layers in the LOCOS etching process are formed over the surface.

Subsequently, the surface is etched away in forms of strips that are perpendicular to each LOCOS 170 from the topmost layer to the floating gates 44 so as to form each stacked gate structure in which the floating-gate 44, the control gate 45, and respective insulating layers are deposited. Furthermore, a silicon oxidation film is formed over the surface and then etched back so as to form a protection layer (not shown) made of the silicon oxidation film with a self-alignment process on sidewalls of the stacked gate structure. After that, strip-shaped resist layers 50 are formed in parallel with the control gates 45 so as to cover portions defining selection transistors 53 and a part of the upper regions in the selection transistor side of the stacked gate structures, seen in FIG. 5B.

Subsequently, the LOCOS 170 is etched away up to the substrate 41 by using the above resist layer 50 and the stacked gate structure as masks, and then n-type impurities are implanted on the surface of the substrate 41 where the LOCOS is removed by using the above resist layer 50 and the stacked gate structure as masks so as to form drain diffusion layers 48 and source diffusion layers 49, seen in FIG. 5C.

The resist layer 50 and the topmost silicon nitride film of the stacked gate structure are removed so as to form a gate oxidation film layer in the portion defining the selection transistor 53 using thermal oxidation.

Figure 5D:
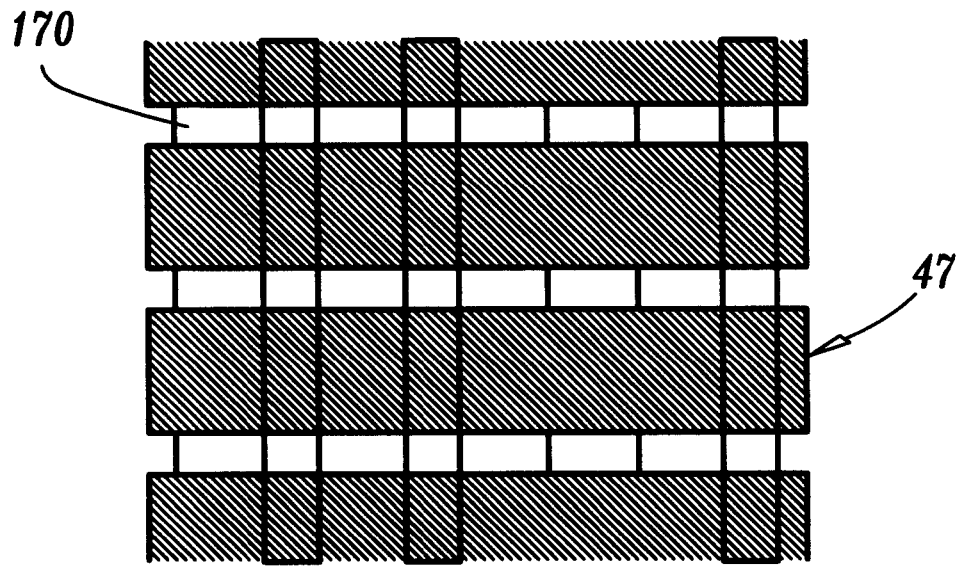
Figure 6:
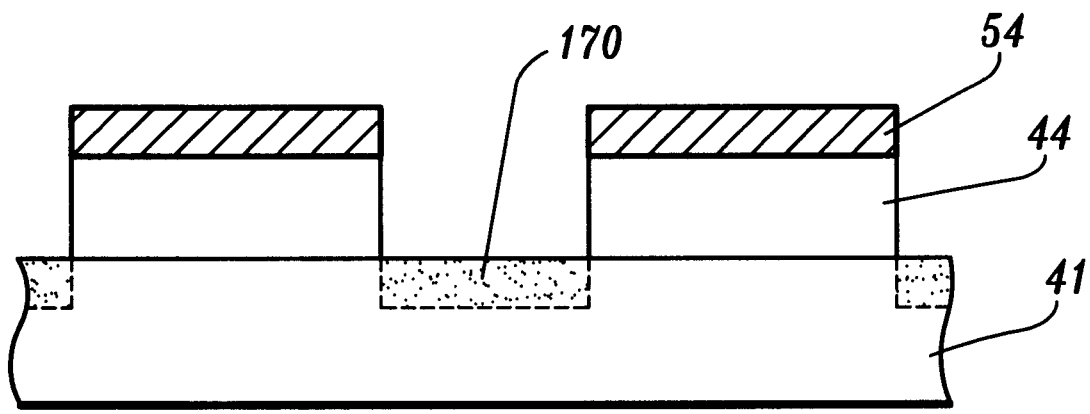
FIG. 6 is a cross-sectional view taken on line 5E—5E in FIG. 5A.

Next, a polysilicon layer (e.g., a polycrystal silicon layer) to be a select gate 47 and a tungsten silicide layer are formed sequentially and then the surface is etched away so that the upper portion of the LOCOS structure is opened and perpendicular to the stacked gate structures so as to form select gates 47 (FIG. 5D).

The semiconductor memory device in FIG. 4 does not need the mask matching allowance (X2) between each stacked gate structure and the LOCOS. Further, the semiconductor memory devices does not need the mask matching allowance (X5) between each source diffusion line 49 and the LOCOS. As noted, these mask matching allowances have prevented the miniaturization of conventional semiconductor memory elements due to the self-alignment features. Furthermore, the semiconductor memory device in FIG. 4 does not need the mask matching allowances Y2 and Y4 between each floating gate 44 and the LOCOS due to the self-alignment process.

As described above, in the semiconductor memory device in FIG. 4 and the example of fabrication process shown in FIGS. 5A–5H and 6, makes it is possible to miniaturize the memory device to the 0.35 to 0.4 $\mu$m level.

Further, in the process in FIGS. 5A–5H, a silicon nitride film used for the topmost layer of each stacked gate structure acts as a mask in the etching process of the LOCOS 170. As a result, it is possible to prevent the silicon oxidation film on the control gate 45 from being etched away in the LOCOS etching process so as not to reduce the thickness of the silicon oxidation film on the control gate 45.

Still further, in the process in FIGS. 5A–5H, it is possible to reduce damage that may occur to the gate oxidation films and the insulating films (e.g., the second insulating film) between the floating gates 44 and the control gates 45 in the LOCOS etching process, since the sidewall portions of the stacked gate structures are covered with the protection layer formed with self-alignment to the stacked gate structures when etching the LOCOSs 170.

Figure 7:
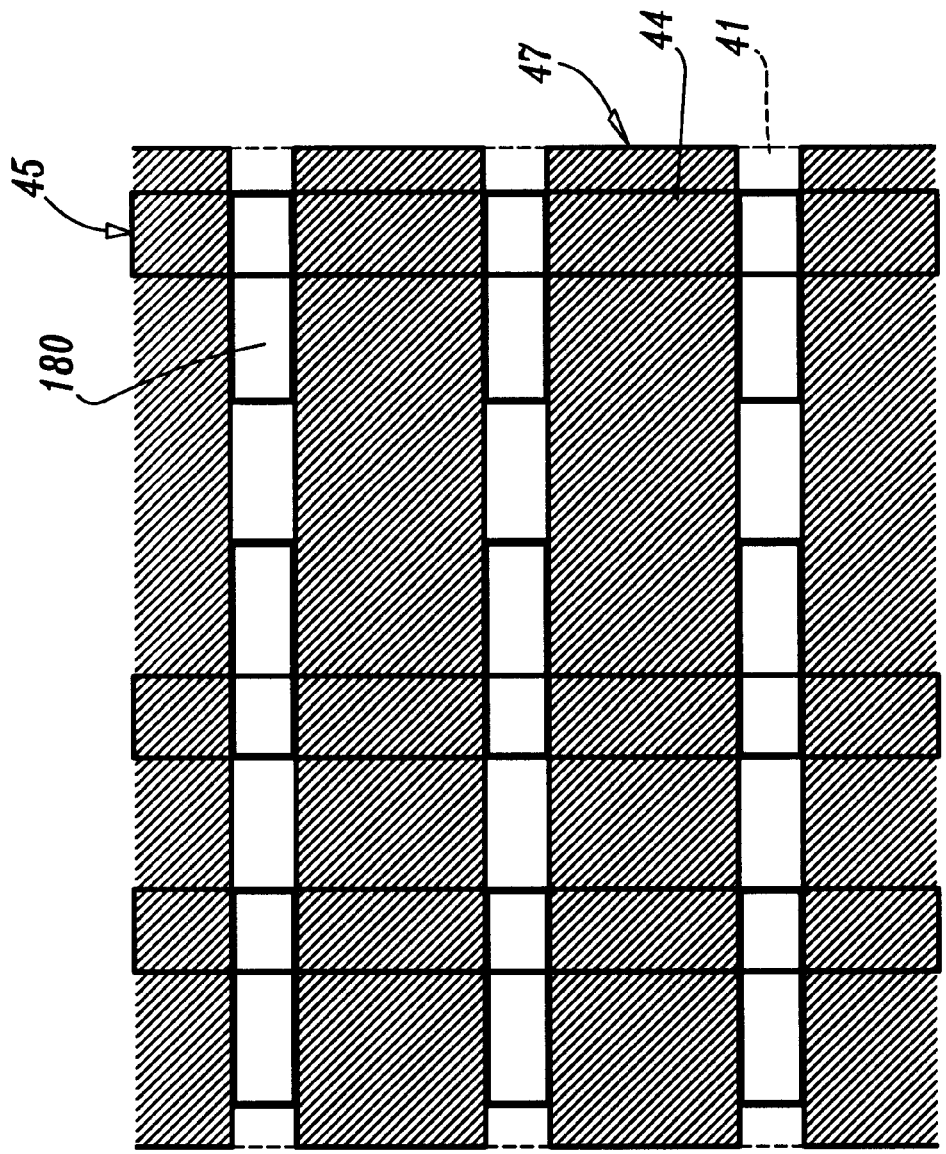
FIG. 7 is an alternative embodiment of the semiconductor memory device of FIG. 4.

FIG. 7 illustrates an alternative embodiment of the semiconductor memory device in FIG. 4. The configuration of the semiconductor memory device in FIG. 7 is substantially the same as the configuration for the semiconductor memory device in FIG. 4. However, the process for fabricating such a semiconductor memory is different. The processes differ in that the LOCOS 170 is formed by oxidizing a part of the substrate 41 in the semiconductor memory device in FIG. 4, whereas, a LOCOS 180 is formed by oxidizing a part of a silicon layer on a substrate 41 in the semiconductor memory device in FIG. 7.

Figure 8D:
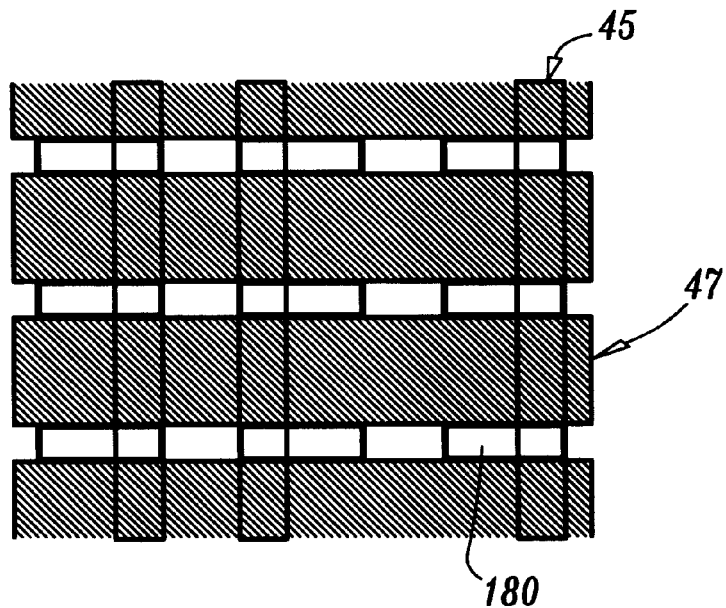
Figure 9:
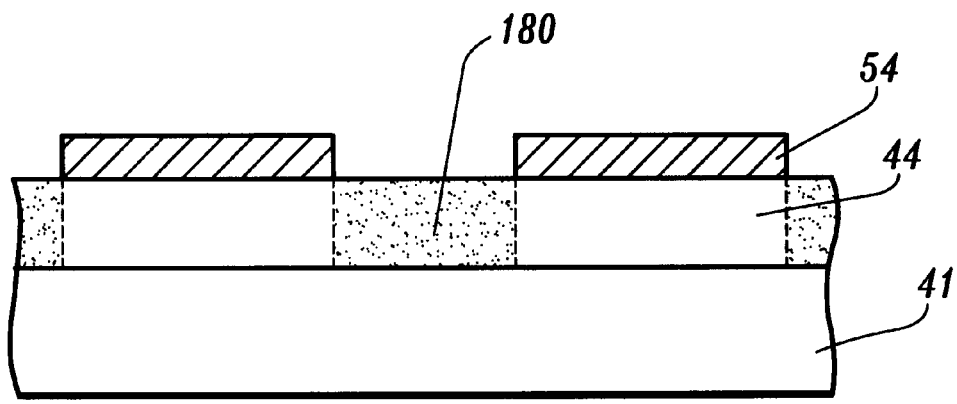
FIG. 9 is a cross-sectional view taken on line 12A–12H in FIG. 8A.

FIGS. 8A–8H illustrate the fabrication process for the semiconductor memory device in FIG. 7. To fabricate the semiconductor memory device shown in FIG. 7, a gate oxidation film is formed by thermal oxidation on a p-type semiconductor substrate 41. A polysilicon layer 44 (e.g., a polycrystal silicon layer) forming a floating gate and a silicon nitride layer 54 forming an oxidation inhibition layer are formed over the gate oxide film. The oxidation inhibition layer 54 (silicon nitride layer) is etched away to form strips (or slits) which are parallel with the direction in which select gates 47 are formed (FIG. 8A). FIG. 9 shows a result of etching the oxidation inhibition layer 54 in forms of strips.

In this process, the polysilicon layer 44 (the polycrystal silicon layer) and further substrate 41 are oxidized using the oxidation inhibition layer 54 as a mask. Each LOCOS 180 for separating respective elements (cells) in the memory cell array are then formed. After that, the silicon nitride film 54 for inhibiting oxidation is removed.

A second insulating film (e.g., an ONO laminated layer of a silicon oxidation film, a silicon nitride film, and a silicon oxidation film) between the floating-gate and the control gate is formed over the surface. A polysilicon layer 45 (e.g., a polycrystal silicon layer) forming control gates are formed over the layer. Further, a silicon oxidation layer forming insulating films between each control gate and the select gate is formed over the layer, and then a silicon nitride film layer acting as a mask in the LOCOS etching process is formed over the layer.

Subsequently, the surface is etched away in forms of strips which are perpendicular to each LOCOS 180 from the topmost layer to the floating-gates 44 so as to form each stacked gate structure. Furthermore, a silicon oxidation film is formed over the surface and then etched back so as to form a protection layer (not shown) made of the silicon oxidation film with a self-alignment process on sidewalls of the stacked gate structure. After that, strip-shaped resist layers 50 are formed in parallel with the control gates 45 so as to cover the portions defining selection transistors 53 and a part of the upper regions in the selection transistor side of the stacked gate structures (FIG. 8B).

Subsequently, the LOCOS 180 is etched away up to the substrate 41 using the above resist layer 50 and the stacked gate structure as masks, and then n-type impurities are implanted on the surface of the substrate 41 where the LOCOS is removed by using the above resist layer 50 and the stacked gate structure as masks so as to form drain diffusion lines 48 and source diffusion lines 49 (FIG. 8C).

Then, the resist layer 50 and the topmost silicon nitride film layer of the stacked gate structure are removed so as to form a gate oxidation layer in the portion defining the selection transistor 53 by means of thermal oxidation.

Next, a polysilicon layer (e.g., a polycrystal silicon layer) forming a select gate 47 and a tungsten silicide layer are sequentially formed, and then the surface is etched away so that the upper portion of the LOCOS 180 is opened and perpendicular to the stacked gate structures so as to form select gates 47 (FIG. 8D).

The semiconductor memory device in FIG. 7 using the fabrication process shown in FIGS. 8A–8H does not need the mask matching allowance (X2) between each stacked gate structure and the LOCOS. Further, the semiconductor memory device does not need the mask matching allowance (X5) between each source diffusion layer and the LOCOS. In addition, the mask matching allowances Y2 and Y4 between each floating gate and the LOCOS are not needed. Accordingly, it is possible to miniaturize the device further in comparison with the conventional devices, and even the 0.35 to 0.4 μm generation devices in which a light wavelength in the lithographic process is almost the same as the pattern size.

Further, in the fabrication process in FIGS. 8A–8H, a silicon nitride film is used for the topmost layer of each stacked gate structure in the etching process of the LOCOS 180. Thus, the silicon oxidation film on the control gate 45 is prevented from being etched away in the LOCOS etching process so as not to reduce the thickness of the silicon oxidation film on the control gate 45.

In the fabrication process in FIGS. 8A–8H, it is possible to reduce damage to the gate oxidation films and the insulating films between the floating gate 44 and the control gate 45 that may occur in the LOCOS etching process since the sidewall portions of the stacked gate structures are covered with the protection layer formed to the stacked gate structures when etching the LOCOS 180.

Figure 10:
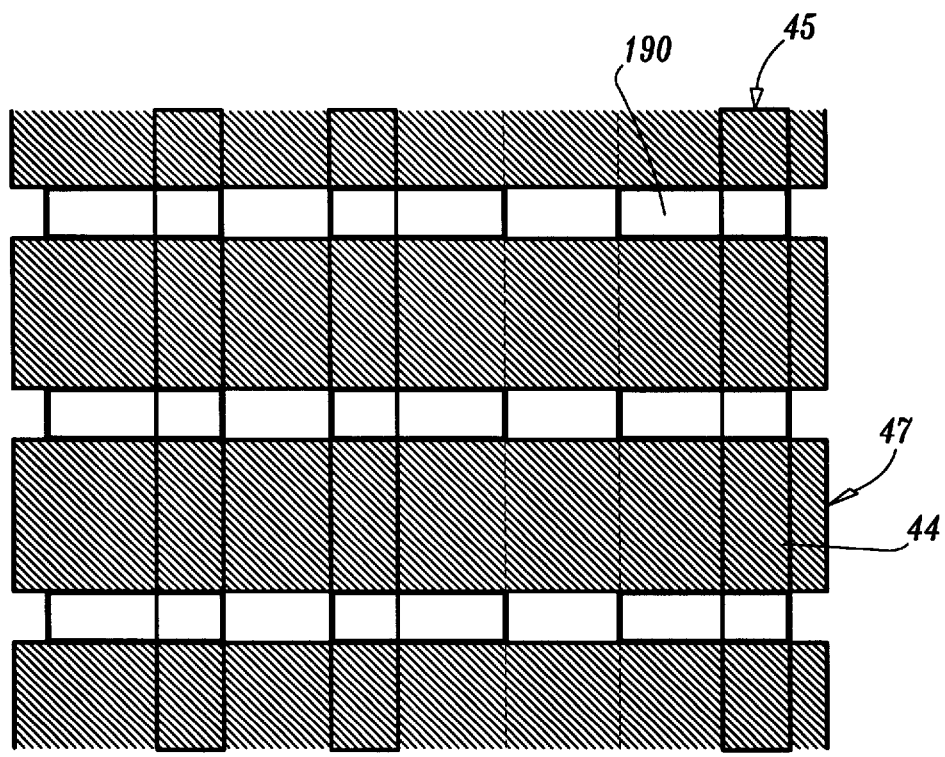
FIG. 10 is another alternative embodiment of the semiconductor memory device in FIG. 4.
Figure 11:
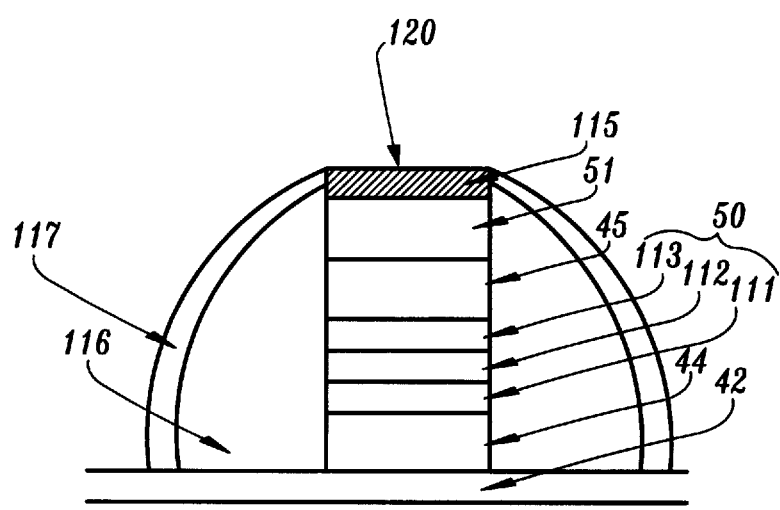
FIG. 11 is a cross-sectional view of the semiconductor memory device in FIG. 10 prior to forming source and drain regions.

FIG. 10 illustrates another alternative embodiment of the semiconductor memory device in FIG. 4. FIG. 11 is a cross-sectional view (a cross-sectional view taken on line X–X' in FIG. 12B described later) before forming n-type impurity diffusion layers (e.g., source and drain regions) of the semiconductor memory device in FIG. 10. The configuration of the semiconductor memory device shown in FIGS. 10 and 11 is substantially the same as the configuration for the semiconductor memory device in FIG. 4. However, the process for fabrication such a semiconductor memory device is different. The processes differ in that the LOCOS 170 is formed by oxidizing a part of the substrate 41 with the sidewalls of the silicon layers 44 which have been etched away, being exposed after the etching of the silicon layers 44 and the oxidation inhibition layer 54 when fabricating the semiconductor memory device in FIG. 4. Whereas LOCOS 190 is formed by oxidizing a part of a substrate 41 after etching a silicon layer 44 and an oxidation inhibition layer 54 and after further forming an inhibition layer on sidewalls of the etched silicon layer 44 when fabricating the semiconductor memory device in FIGS. 10 and 11.

Figure 12D:
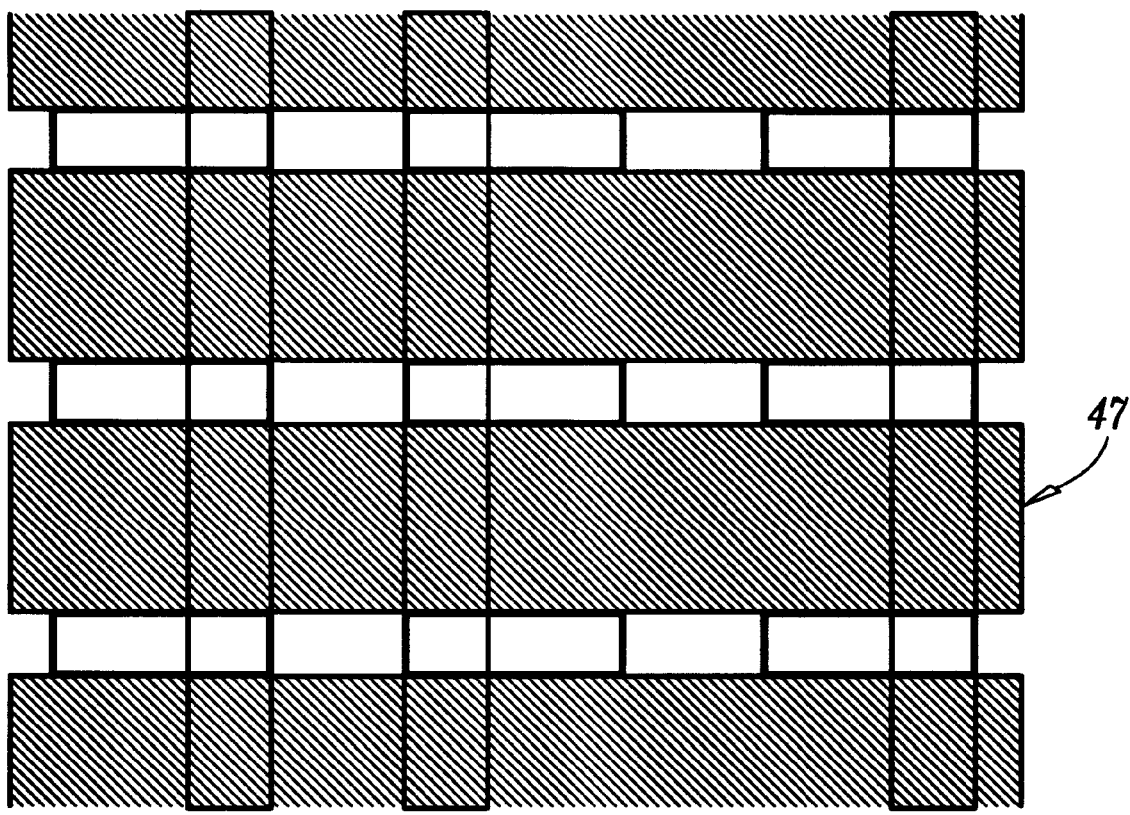

FIGS. 12A–12D illustrate the fabrication process of the semiconductor memory device in FIGS. 10 and 11. To fabricate the semiconductor memory device in FIGS. 10 and 11. A gate oxidation film is formed by thermal oxidation on a p-type semiconductor substrate 41. A polysilicon layer 44 (e.g., a polycrystal silicon layer) forming a floating gate and a silicon nitride layer 54 forming an oxidation inhibition layer are formed over the gate oxidation film. The oxidation inhibition layer 54 (the silicon nitride film) and the polysilicon layer 44 are etched away to form strips (or slits) in parallel with the direction in which a select gate 47 is formed (FIG. 12A).

Figure 13:
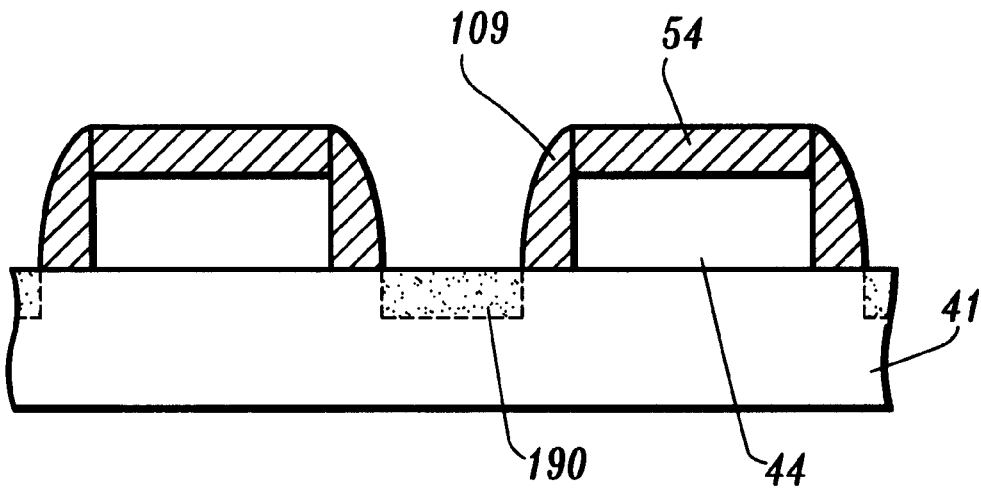
FIG. 13 is a cross-sectional view taken on line 12E—12E in FIG. 12A.

Next, a silicon nitride film is formed over the surface and then etched back so as to form a sidewall protection layer 109 (seen in FIG. 13) on the sidewalls of the floating-gate 44 and the silicon nitride film layer 54 for inhibiting oxidation. FIG. 13 shows a result of forming the protection layer 109 on the sidewalls of the floating gate 44 and the oxidation inhibition layers 54.

In this process, the substrate 41 is oxidized using the oxidation inhibition layer 54 and the protection layer 109 as masks. The LOCOS 190 for separating respective elements (cells) in the memory cell array is then formed on the substrate 41. After that, the oxidation inhibition layer 54 and the protection layer 109 are removed.

A second insulating film (e.g., an ONO laminated layer of a silicon oxidation film 111, a silicon nitride film 112, and a silicon oxidation film 113, seen in FIG. 11) is formed over the floating gate. A polysilicon layer 45 (e.g., a polycrystal silicon layer) forming control gates is formed over the second insulating film. A silicon oxidation layer forming an insulating film 51 between the control gate 45 and the select gate 47 is formed over the control gate. Then, a silicon nitride layer 115 acting as a mask layer in the LOCOS etching process is formed over the insulating film 51.

Subsequently, the surface is etched away to form strips perpendicular to the LOCOS 190 from the topmost layer to the floating gate 44 so as to form each stacked gate structure 120. A silicon oxidation film is then formed over the surface and then etched back, as seen in FIG. 11, so as to form a protection layer 116 made of the silicon oxidation film in a self-alignment process on the sidewalls of the stacked gate structure 120.

A silicon nitride film is formed over the protection layer 116 and the silicon nitride layer 115 and then etched back so as to form a protection layer 117 on the sidewalls of the stacked gate structure 120. The protection layer is made with the self-alignment process.

After that, strip-shaped resist layer 50 is formed in parallel with the control gate 45 so as to cover portions forming selection transistors 53 and a part of the upper regions in the selection transistor side of the stacked gate structures 120 (FIG. 12B). Subsequently, the LOCOS 190 is etched away up to the substrate 41 using the resist layer 50 and the stacked gate structure 120 as masks, and then n-type impurities are implanted on the surface of the substrate 41 where the LOCOS is removed by using the above resist layer 50 and the stacked gate structure as masks so as to form drain diffusion lines 48 and source diffusion lines 49 (FIG. 12C). At this point, the n-type impurities are implanted from two directions which are diagonally above and from a direction parallel with the control gate 45, and opposing each other. The directions are indicated by arrows A and A' in FIG. 12C.

After that, the resist layer 50 and the topmost silicon nitride film layer 115 of the stacked gate structure are removed so as to form a gate oxidation layer in the portions forming the selection transistor 53 by thermal oxidation.

A polysilicon layer (e.g., a polycrystal silicon layer) forming a select gate 47 and a tungsten silicide layer are sequentially formed and then the surface is etched away so that the upper portion of the LOCOS 190 is opened and perpendicular to the stacked gate structure 120 so as to form the select gate 47 (FIG. 12D).

The semiconductor memory device in FIGS. 10 and 11 does not need the mask matching allowance (X2) between each stacked gate structure and the LOCOS. Further, the semiconductor memory device does not need the mask matching allowance (X5) between each source diffusion layer and the LOCOS. As noted, these mask matching allowances have prevented the miniaturization of conventional semiconductor memory devices. The mask matching allowances Y2 and Y4 are also no longer needed between each floating gate and the LOCOS because of the self-alignment feature of the sidewall.

Further, in the process in FIGS. 12A–12H, a silicon nitride film 115 is used for the topmost layer of each stacked gate structure 120. In the etching process of the LOCOS 190 it is possible to prevent the silicon oxidation film 51 formed on the control gate 45 from being etched away in the LOCOS etching process so as not to reduce the thickness of the silicon oxidation film 51.

Still further, in the fabrication process in FIGS. 12A–12H, it is possible to reduce damage that may occur to the gate oxidation films and the insulating films between each floating-gate 44 and the control gate 45 in the LOCOS etching process. This occurs because the sidewall portions of the stacked gate structures 120 are covered with the protection layers 116 and 117 formed in self-alignment to the stacked gate structures when etching the LOCOS 190.

Furthermore, in the semiconductor memory device in FIG. 10 and in the processes in FIGS. 12A–12H, ion implantation is applied for doping the substrate with n-type impurity regions forming source or drain lines. The ion implantation is performed in two different directions which are indicated by A and A' in FIG. 12C, by which there is no effect of a difference between the levels of a source line 49 and a drain line 48 caused by the LOCOS etching process. That is, an effect caused by a difference between levels which could cause shaded regions which block ion implantation can be prevented. This prevents an increase of resistance values of the source line 49 and the drain line 48.

In addition, in the semiconductor memory device in FIG. 10 in the example of the processes in FIGS. 12A–12H, a silicon nitride film 115 is used for the topmost layer of each protection layer on the sidewalls of the stacked gate structure 120 in the etching process of the LOCOS, so that it is possible to prevent the thickness of the sidewall protection layer from being reduced during LOCOS etching.

It will be understood that various modifications can be made to the embodiments of the present invention herein without departing from the spirit and scope thereof. Therefore, the above description should not be construed as limiting the invention, but merely as preferred embodiments thereof. Those skilled in the art will envision other modifications within the scope and spirit of the invention as defined by the claims appended hereto.

What is claimed is:

1. A method of fabricating a semiconductor memory device in which respective semiconductor memory elements are arranged in a matrix, characterized by each semiconductor memory element having a floating-gate formed through a first insulating film on a semiconductor substrate, a line-shaped control gate which covers said floating-gate through a second insulating film, a line-shaped select gate arranged perpendicularly to said control gate and extending on top and side surfaces of a laminated stacked gate structure including said floating-gate and said control gate through an insulating film and extending on a part of the substrate through the first insulating film on the substrate, and line-shaped source and drain regions arranged alternately and in parallel with said control gate, one of the source region and the drain region being arranged offset to said control gate or said stacked gate structure (hereinafter, the offset portion is referred to as a selection transistor) so as to allow a matrix selection for respective semiconductor memory element regions by use of the control gate and the select gate, said method comprising steps of:

forming LOCOSs in forms of stripes in parallel with a direction in which a select gate is formed, the LOCOSs for separating respective semiconductor memory elements;

forming said stacked gate structures each including the floating-gate and the control gate perpendicularly to the LOCOSs;

forming stripe-shaped resist layers in parallel with the control gate so as to cover portions to be selection transistors and a selection transistor side of said stacked gate structures;

etching the LOCOSs by using said resist layers and said stacked gate structures as masks;

forming impurity diffusion layers to be source lines and drain lines by using said resist layers and said stacked gate structures as masks; and forming select gates.

2. A method of fabricating a semiconductor memory device in which respective semiconductor memory elements are arranged in a matrix, characterized by each semiconductor memory element having a floating-gate formed through a first insulating film on a semiconductor substrate, a line-shaped control gate which covers said floating-gate through a second insulating film, a line-shaped select gate arranged perpendicularly to said control gate and extending on top and side surfaces of a laminated stacked gate structure including said floating-gate and said control gate through an insulating film and extending on a part of the substrate through the first insulating film on the substrate, and line-shaped source and drain regions arranged alternately and in parallel with said control gate, one of the source region and the drain region being arranged offset to said control gate or said stacked gate structure (hereinafter, the offset portion is referred to as a selection transistor) so as to allow a matrix selection for respective semiconductor memory element regions by use of the control gate and the select gate, said method comprising steps of:

forming a silicon layer on a substrate to form a floating-gate over a region where each semiconductor memory element is formed;

forming an oxidation inhibition layer on the silicon layer for inhibiting diffusion of oxygen;

etching said oxidation inhibition layer and said silicon layer in forms of stripes in parallel with a direction in which a select gate is formed;

forming LOCOSs for separating respective semiconductor memory elements after oxidizing the substrate by using the oxidation inhibition layer as a mask;

forming said stacked gate structures each including the floating-gate, the control gate, and respective insulating layers perpendicularly to the LOCOSs;

forming stripe-shaped resist layers in parallel with the control gate so as to cover portions to be selection transistors and a selection transistor side of said stacked gate structures;

etching the LOCOSs by using said resist layers and said stacked gate structures as masks;

forming impurity diffusion layers to be source lines and drain lines by using said resist layers and said stacked gate structures as masks; and forming select gates.

3. A method of fabricating a semiconductor memory device in which respective semiconductor memory elements are arranged in a matrix, characterized by each semiconductor memory element having a floating-gate formed through a first insulating film on a semiconductor substrate, a line-shaped control gate which covers said floating-gate through a second insulating film, a line-shaped select gate arranged perpendicularly to said control gate and extending on top and side surfaces of a laminated stacked gate structure including said floating-gate and said control gate through an insulating film and extending on a part of the substrate through the first insulating film on the substrate, and line-shaped source and drain regions arranged alternately and in parallel with said control gate, one of the source region and the drain region being arranged offset to said control gate or said stacked gate structure (hereinafter, the offset portion is referred to as a selection transistor) so as to allow a matrix selection for respective semiconductor memory element regions by use of the control gate and the select gate, said method comprising steps of:

forming a silicon layer to be a floating-gate over a region where each semiconductor memory element is formed;

forming an oxidation inhibition layer on the silicon layer for inhibiting diffusion of oxygen;

etching said oxidation inhibition layer in forms of stripes in parallel with a direction in which a select gate is formed;

forming LOCOSs for separating respective semiconductor memory elements after oxidizing the silicon layer by using the oxidation inhibition layer as a mask;

forming said stacked gate structures each including the floating-gate, the control gate, and respective insulating layers perpendicularly to the LOCOSs;

forming stripe-shaped resist layers in parallel with the control gate so as to cover portions to be selection transistors and a selection transistor side of said stacked gate structures;

etching the LOCOSs by using said resist layers and said stacked gate structures as masks;

forming impurity diffusion layers to be source lines and drain lines by using said resist layers and said stacked gate structures as masks; and forming select gates.

4. A method of fabricating a semiconductor memory device in which respective semiconductor memory elements are arranged in a matrix, characterized by each semiconductor memory element having a floating-gate formed through a first insulating film on a semiconductor substrate, a line-shaped control gate which covers said floating-gate through a second insulating film, a line-shaped select gate arranged perpendicularly to said control gate and extending on top and side surfaces of a laminated stacked gate structure including said floating-gate and said control gate through an insulating film and extending on a part of the substrate through the first insulating film on the substrate, and line-shaped source and drain regions arranged alternately and in parallel with said control gate, one of the source region and the drain region being arranged offset to said control gate or said stacked gate structure (hereinafter, the offset portion is referred to as a selection transistor) so as to allow a matrix selection for respective semiconductor memory element regions by use of the control gate and the select gate, said method comprising steps of:

forming a silicon layer to be a floating-gate over a region where each semiconductor memory element is formed;

forming an oxidation inhibition layer on the silicon layer for inhibiting diffusion of oxygen;

etching said oxidation inhibition layer and said silicon layer in forms of stripes in parallel with a direction in which a select gate is formed;

forming a sidewall protection layer on sidewalls of the floating gate and the oxidation inhibition layer with self-alignment;

forming LOCOSs for separating respective semiconductor memory elements after oxidizing the substrate by using the oxidation inhibition layer and the sidewall protection layer as masks;

forming said stacked gate structures each including the floating-gate, the control gate, and respective insulating layers perpendicularly to the LOCOSs;

forming stripe-shaped resist layers in parallel with the control gate so as to cover portions to be selection transistors and a selection transistor side of said stacked gate structures;

etching the LOCOSs by using said resist layers and said stacked gate structures as masks;

forming impurity diffusion layers to be source lines and drain lines by using said resist layers and said stacked gate structures as masks; and forming select gates.

5. A method of fabricating a semiconductor memory device in which respective semiconductor memory elements are arranged in a matrix, characterized by each semiconductor memory element having a floating-gate formed through a first insulating film on a semiconductor substrate, a line-shaped control gate which covers said floating-gate through a second insulating film, a line-shaped select gate arranged perpendicularly to said control gate and extending on top and side surfaces of a laminated stacked gate structure including said floating-gate and said control gate through an insulating film and extending on a part of the substrate through the first insulating film on the substrate, and line-shaped source and drain regions arranged alternately and in parallel with said control gate, one of the source region and the drain region being arranged offset to said control gate or said stacked gate structure (hereinafter, the offset portion is referred to as a selection transistor) so as to allow a matrix selection for respective semiconductor memory element regions by use of the control gate and the select gate, said method comprising steps of:

forming a silicon layer to be a floating-gate over a region where each semiconductor memory element is formed;

etching said silicon layer in forms of stripes in parallel with a direction where a select gate is formed;

forming an oxidation inhibition layer so as to cover top and sidewall surfaces of said silicon layer formed in a stripe;

forming a sidewall protection layer on sidewalls of the floating gate and the oxidation inhibition layer with self-alignment;

forming LOCOSs for separating respective semiconductor memory elements after oxidizing the substrate by using the oxidation inhibition layer and the sidewall protection layer as masks;

forming said stacked gate structures each including the floating-gate, the control gate, and respective insulating layers perpendicularly to the LOCOSs;

forming stripe-shaped resist layers in parallel with the control gate so as to cover portions to be selection transistors and a selection transistor side of said stacked gate structures;

etching the LOCOSs by using said resist layers and said stacked gate structures as masks;

forming impurity diffusion layers to be source lines and drain lines by using said resist layers and said stacked gate structures as masks; and forming select gates.

6. A method of fabricating a semiconductor memory device as in one of claims 1 to 5, in which said LOCOS etching is performed after depositing a silicon nitride film as a topmost layer of the stacked gate structure including the floating-gate and the control gate.

7. A method of fabricating a semiconductor memory device as in one of claims 1 to 5, in which said LOCOS etching is performed after covering the sidewall portions of the stacked gate structure including the floating-gate and the control gate with a protection layer formed with self-alignment to the stacked gate structure.

8. A method of fabricating a semiconductor memory device according to claim 7, in which the topmost layer of the protection layer on the sidewall portions of the stacked gate structure is formed by a silicon nitride film.

9. A method of fabricating a semiconductor memory device as in one of claims 1 to 5, in which said source/drain regions are formed by ion implantation and diffusion with predetermined inductive impurity and the ion implantation is performed at least in two directions different each other.

* * * * *